United States Patent [19]
Saeki et al.

[11] Patent Number: 6,068,704
[45] Date of Patent: May 30, 2000

[54] TRANSFER ARM APPARATUS AND SEMICONDUCTOR PROCESSING SYSTEM USING THE SAME

[75] Inventors: Hiroaki Saeki; Teruo Asakawa, both of Yamanashi-ken, Japan

[73] Assignee: Tokyo Electron Limited, Tokyo, Japan

[21] Appl. No.: 08/969,945

[22] Filed: Nov. 25, 1997

[30] Foreign Application Priority Data

Nov. 26, 1996 [JP] Japan .................................. 8-330316

[51] Int. Cl.⁷ .................................................. C23C 16/00
[52] U.S. Cl. .................................. 118/729; 156/345 WH; 414/939
[58] Field of Search ................... 118/729; 901/14–16, 901/19; 156/345 WH; 414/935, 937, 939

[56] References Cited

U.S. PATENT DOCUMENTS

| | | | |
|---|---|---|---|
| 4,951,601 | 8/1990 | Maydan et al. | 118/729 |
| 5,151,008 | 9/1992 | Ishida et al. | 901/15 |
| 5,333,986 | 8/1994 | Mizukami et al. | 901/15 |
| 5,431,529 | 7/1995 | Eastman et al. | 901/15 |
| 5,885,052 | 3/1999 | Tsuji et al. | 414/744.6 |

FOREIGN PATENT DOCUMENTS

| | | |
|---|---|---|
| 63-252439 | 10/1988 | Japan . |
| 3-22057 | 3/1991 | Japan . |
| 5-26318 | 2/1993 | Japan . |
| 6-30372 | 4/1994 | Japan . |
| 7-1375 | 1/1995 | Japan . |
| 7-288275 | 10/1995 | Japan . |
| 8-39463 | 2/1996 | Japan . |

*Primary Examiner*—Shrive Beck
*Assistant Examiner*—Sylvia R. MacArthur
*Attorney, Agent, or Firm*—Oblon, Spivak, McClelland, Maier & Neustadt, P.C.

[57] ABSTRACT

A transfer arm apparatus has first, second, and third arms. The second arm has a proximal link pivotally mounted on the distal end of the first arm, and first and second links connecting the proximal link and the third arm to constitute a link mechanism. The first and second links form a first pair of parallel links, and the proximal link and the third link form a second pair of parallel links connecting the first pair of parallel links. A transmission is contained in the first arm, and has an axial shaft and a hollow axial shaft coaxially arranged at the distal end of the first arm. The axial shaft transmits a rotational driving force to the first pair of parallel links, and the hollow axial shaft transmits a rotational driving force to the second pair of parallel links through the proximal link.

16 Claims, 8 Drawing Sheets

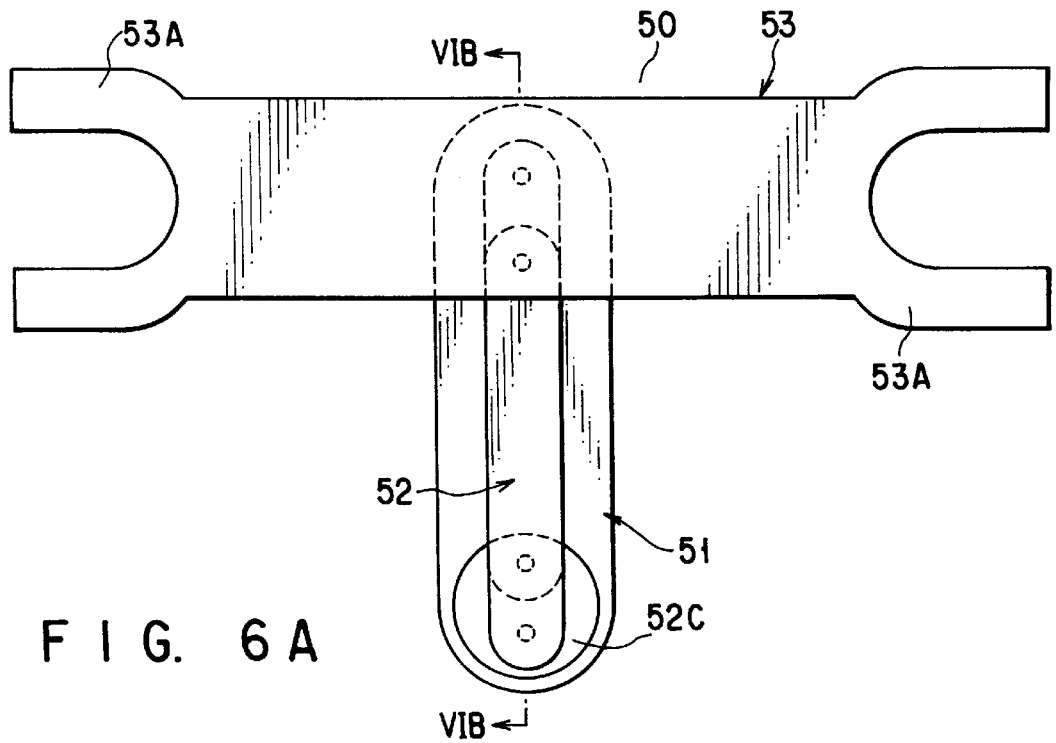
F I G. 6A
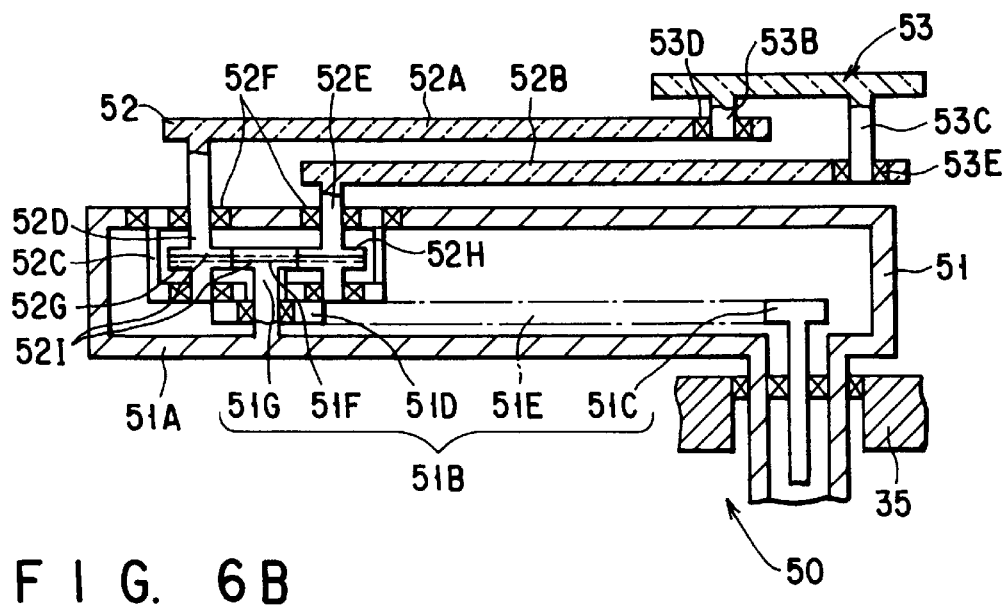
F I G. 6B

TRANSFER ARM APPARATUS AND SEMICONDUCTOR PROCESSING SYSTEM USING THE SAME

BACKGROUND OF THE INVENTION

1. Field of the Invention

The present invention relates to a transfer arm apparatus for transferring a target substrate, such as a semiconductor wafer or an LCD substrate, and a semiconductor processing system using the transfer arm apparatus. The semiconductor process includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In a process of manufacturing a semiconductor device, a transfer arm apparatus is used for loading and unloading a target substrate to and from a process chamber. FIG. 9 is a plan view schematically showing the structure of a transfer arm apparatus 90 which is conventionally typical. The transfer arm apparatus 90 has a first arm 91 capable of bidirectionally pivoting, a second arm 92 pivotally connected to the distal end of the first arm 91, and third arm 93 pivotally connected to the distal end of the second arm 92. A target substrate, e.g., a semiconductor wafer is transferred while it is mounted on the distal end of the third arm 93. The first and second arms 91 and 92 contain pulley mechanisms (not shown), with which the second and third arms 92 and 93 can be bent and stretched.

Since the transfer arm apparatus 90 is designed to transfer only one target substrate, i.e., one wafer, at a time, the process chamber cannot be efficiently loaded and unloaded with wafers, and a limit is brought about improving throughput. Accordingly, if the third arm is modified to have two wafer support portions, one on either end, in order to transfer two wafers together by the third arm, the throughput can be improved. However, where this modification is applied to the transfer arm apparatus 90, the following problems arise.

Specifically, in this case, the third arm needs to be connected, by its central portion in the longitudinal direction, to the distal end of the second arm, in order to allow the wafer support portions at opposite ends of the third arm to be equivalently usable. Since the length of the third arm should not be so large in light of its operation space, that distance from the connecting portion between the second and third arms to each of the wafer support portions at opposite ends of the third arm inevitably becomes short. As a result, upon transferring a wafer to and from a process chamber, the connecting portion between the second and third arms has to enter the process chamber. When the connecting portion of the arms enters the process chamber, in which the temperature may be at least 1000° C., part of the pulley mechanism at the connecting portion is damaged by the high temperature.

More specifically, the pulley mechanism is usually surrounded by a casing and the connecting portion of the arms is vacuum-sealed by an airtight structure formed of a magnetic fluid seal to prevent the wafer from being contaminated with particles and impurity gases generated from the pulley mechanism and belts. Since the magnetic fluid seal is apt to be degraded by heat, when the connecting portion between the second and third arms are exposed to the high temperature, the airtight structure of the magnetic fluid seal is degraded and damaged, and so are the belts of the pulley mechanism.

On the other hand, there is a conventional transfer arm apparatus of another type, which has first and second arms respectively formed of link mechanisms. The transfer arm apparatus of this type requires a number of links to be used, thereby bringing about a difficulty in providing a structure suitable for a narrow and low-height space, such as a transfer chamber. In addition, since the link mechanisms each have a change point, i.e., a dead point, the first and second arms can be hardly stretched out. When the link mechanisms are stretched up to a near dead point, the first and the second arms become unstable in its posture and can hardly transfer a wafer to a predetermined position, e.g., a wafer chuck, in a process chamber. Further, the transfer arm apparatus of this type cannot provide a sufficient transfer stroke in spite of the length of the first and second arms.

BRIEF SUMMARY OF THE INVENTION

An object of the present invention is to provide a transfer arm apparatus having a simple structure, which is capable of accurately transferring a target substrate to a predetermined position without any damage even under a high temperature.

According to the present invention, there is provided a transfer arm apparatus for a semiconductor process, comprising:

a first arm bidirectionally pivotable about its proximal end;

a second arm connected by its proximal end to a distal end of the first arm, the second arm being bidirectionally pivotable about its proximal end relative to the first arm;

a third arm connected by its central portion to a distal end of the second arm, the third arm having support portions, each for supporting a target substrate, on opposite ends, wherein the second arm has a proximal link pivotally mounted on the distal end of the first arm, and first and second links connecting the proximal link and the third arm to constitute a link mechanism, the first and second links forming a first pair of parallel links, and the proximal link and the third link forming a second pair of parallel links connecting the first pair of parallel links;

a transmission supported by the first arm, and having first and second rotational axis members coaxially arranged at the distal end of the first arm, the first rotational axis member being for transmitting a rotational driving force to the first pair of parallel links, and the second rotational axis member being for transmitting a rotational driving force to the second pair of parallel links through the proximal link; and a driving mechanism for supplying the rotational driving forces to the first arm and the transmission.

In a first aspect, the first link consists of a driving link directly connected to the first rotational axis member, and the second link consists of a driven link freely and pivotally mounted on the proximal link. The second arm may further comprise a third link connecting the proximal link and the third arm. Where the third link consists of a driven link freely and pivotally mounted on the proximal link, it is preferable that the second and third links are symmetrically arranged to interpose the first link therebetween.

In a second aspect, the first and second link consist of driving links which are directly connected to the first rotational axis member. The first and second links consisting of the driving links may be asymmetrically arranged relative to a line connecting pivotal axes of the first and second arms.

In this case, it is preferable that the first rotational axis member is fixed to the first link and the second link is pivotally mounted on the proximal link. The first and second links consisting of the driving links may be symmetrically arranged relative to a line connecting pivotal axes of the first and second arms. In this case, the first and second links are pivotally mounted on the proximal link.

In both of the first and second aspects, when the transfer arm apparatus is bent or stretched, it is preferable that the proximal link is driven to pivot relative to the first arm by an angle the same as that of the first arm in a direction reverse to that of the first arm, and the first and second links are driven to pivot relative to the first arm by an angle two times larger than that of the first arm in a direction reverse to that of the first arm. Further, a distance between pivotal axes of the first and second arms and a distance between pivotal axes of the second and third arms are preferably set to be the same.

According to the present invention, there is also provided a semiconductor processing system, comprising:

an airtight process chamber which is provided with a work table arranged in the process chamber for supporting a target substrate, a supply for supplying a process gas into the process chamber, and an exhaust for exhausting and setting the process chamber into a vacuum state; and an airtight transfer chamber which is connected to the process chamber through a gate and is provided with the above described transfer arm apparatus for loading and unloading target substrates to and from the process chamber.

In a semiconductor processing system of a multi-chamber type, another process chamber or other process chambers are connected to the transfer chamber each through a gate, and the transfer arm apparatus is used for loading and unloading target substrates to and from all of the process chambers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are a plan view showing a transfer arm apparatus according to still another embodiment of the present invention, and a cross-sectional view taken along line VIB—VIB in FIG. 6A, respectively;

DETAILED DESCRIPTION OF THE INVENTION

Figure 1:
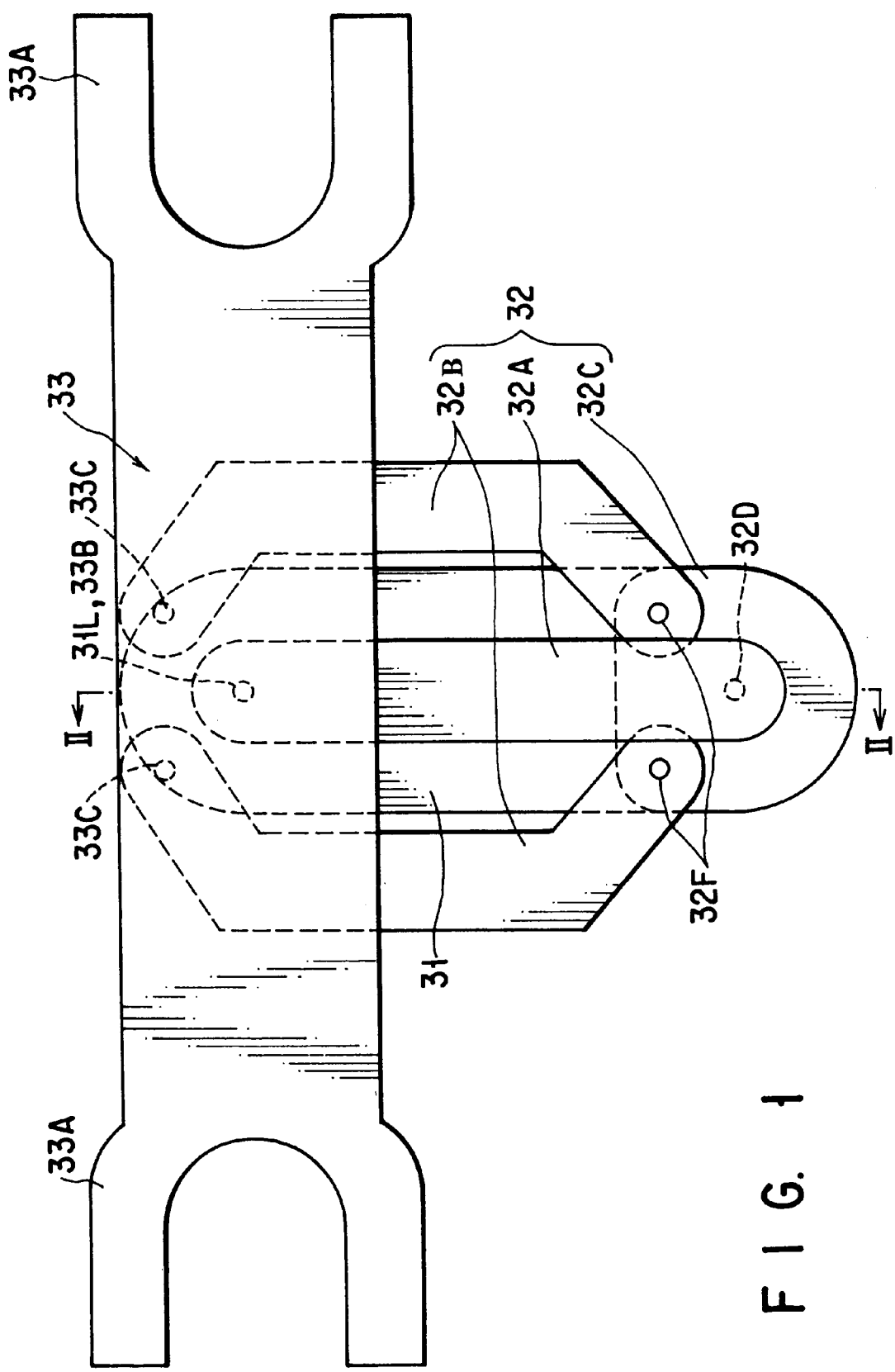
FIG. 1 is a plan view showing a transfer arm apparatus according to an embodiment of the present invention.
Figure 2:
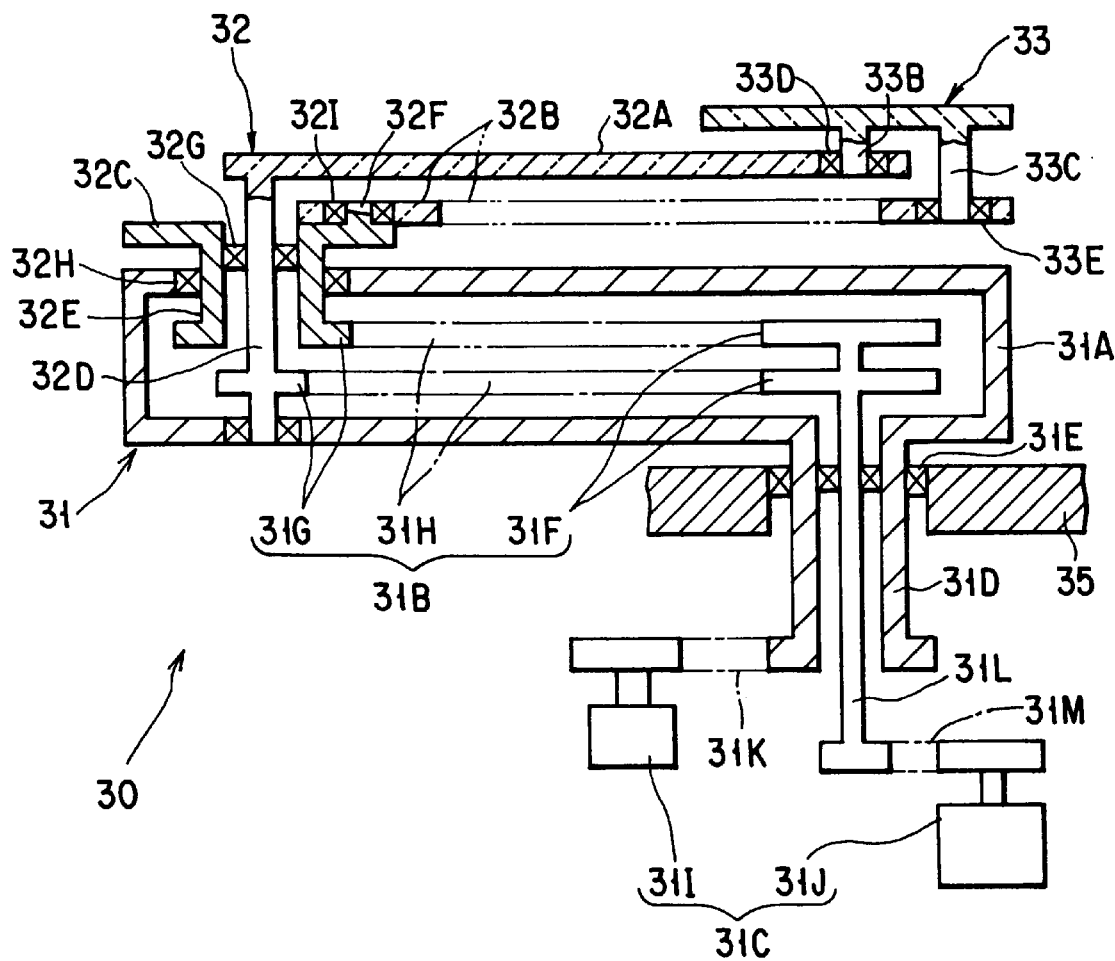
FIG. 2 is a cross-sectional view taken along line II—II in FIG. 1.

FIG. 1 is a plan view showing a transfer arm apparatus according to an embodiment of the present invention and FIG. 2 is a cross-sectional view taken along line II—II in FIG. 1.

The transfer arm apparatus 30 according to this embodiment has a first arm 31 mounted on a base table 35, a second arm 32 connected by its proximal end to the distal end of the first arm 31, and a third arm 33 connected by its central portion to the distal end of the second arm 32. The first and second arms 31 and 32 are bent and stretched relative to each other so that the third arm 33 is operable. Wafer support portions 33A each for supporting a semiconductor wafer are formed at the opposite ends of the third arm 33, respectively. Accordingly, the transfer arm apparatus 30 can transfer two wafers at a time while supporting the wafers on the wafer support portions 33A, respectively.

The first arm 31 has a casing 31A having, for example, a long, narrow shape, as shown in FIG. 2. A transmission 31B is arranged in the casing 31A, and is driven by a driving mechanism 31C disposed under the base table 35. A hollow axial shaft 31D extends downward from the bottom surface of the proximal end of the casing 31A. The hollow axial shaft 31D is rotatably supported by a bearing 31E in a hole formed in the base table 35. In the center of the top surface of the distal end of the casing 31A, there is formed another hole through which the second arm 32 is connected.

The transmission 31B includes upper and lower first pulleys 31F, upper and lower second pulleys 31G rotatably supported at the distal end of the casing 31A, and upper and lower belts 31H wound around the first and second pulleys 31F and 31G, as shown with one-dot chain lines. The upper one of the second pulleys 31G has the same diameter as the corresponding upper one of the first pulleys 31F. The lower one of the second pulleys 31G has half the diameter of the corresponding lower one of the first pulleys 31F. The second pulleys 31G are integrated with a link of the second arm 32, as described later. The lower one of the second pulleys 31G functions as part of a first rotational axis member, while the upper one of the second pulleys 31G functions as part of a second rotational axis member.

The driving mechanism 31C includes a first motor 31I for driving the casing 31A through the hollow axial shaft 31D to bidirectionally pivot and a second motor 31J for driving the first pulley 31F to bidirectionally rotate through an axial shaft 31L coaxially arranged in the hollow axial shaft 31D. The first motor 31I and the hollow axial shaft 31D are connected by a belt 31K, as shown with one-dot chain lines. The first arm 31 is driven by the first motor 31I to pivot along with the hollow axial shaft 31D. The second motor 31J and the axial shaft 31L of the first pulley 31F are connected by a belt 31M, as shown with one-dot chain lines. The fist pulley 31F is driven to rotate by the second motor 31J. The belts 31K and 31M are not necessarily required, but a structure of a direct driving type may be adopted such that the axial shafts are directly driven by the corresponding motors.

As shown in FIGS. 1 and 2, the second arm 32 has a long, narrow driving link 32A bidirectionally and pivotally connected by its proximal end to the axial shaft of the second pulley 31G, and a pair of left and right driven links 32B, one on either side below the driving link 32A. The driven links 32B are symmetrically connected by their proximal ends to a proximal link 32C having an essentially square shape. The third arm 33 is connected to the distal ends of the driving link 32A and driven links 32B in a manner as described later, so that a link mechanism is constituted. The axial shaft of the lower one of the second pulleys 31G will be referred to as part of the first rotational axis member, and will be referred to as such in the other embodiments.

The driving link 32A is provided with an axial shaft 32D which extends downward from the center of the lower surface at its proximal end and also functions as the axial shaft of the second pulleys 31G. The pair of driven links 32B has the same shape, in which opposite ends of each link are bent toward the same direction, as shown in FIG. 1. The driven links 32B are symmetrically arranged, one on either side of the driving link 32A, such that their bent ends face each other. Holes for pins are respectively formed at opposite ends of each of the driven links 32B.

The proximal link 32C is provided with a hollow axial shaft 32E, which extends downward from the center of a region slightly closer to its proximal end, and through which the axial shaft 32D of the driving link 32A coaxially penetrates, as shown in FIG. 2. A pair of pins 32F are formed at left and right positions near the distal end of the proximal link 32 and are inserted in the holes formed in the proximal ends of the driven links 32B.

The axial shaft 32D of the driving link 32A is rotatably supported by a bearing 32G in the hollow axial shaft 32E. The hollow axial shaft 32E is rotatably supported by a bearing 32H in a hole formed at the center of the distal end of the first arm 31. Each of the pins 32F are rotatably supported by a bearing 32I in the hole formed in the proximal end of the corresponding driven link 32B. The hollow axial shaft 32E integrated with the proximal link 32C will be referred to as part of the second rotational axis member, and will be referred to as such in the other embodiments.

A first pin 33B extends downward from the center of the third arm 33, as shown in FIG. 2. Further, two second pins 33C extend downward and are equidistantly separated from the first pin 33B in the longitudinal direction of the third arm 33. The second pins 33C extend downward further than the first pin 33B from positions close to one side of the third arm 33. The first pin 33B is rotatably supported by a baring 33D in the hole formed in the distal end of the driving link 32A. Each of the second pins 33C are rotatably supported by a bearing 33E in the hole formed in the distal end of the corresponding driven link 32B.

In other words, in this embodiment, the driving link 32A and each of the driven links 32D of the second arm 32 constitute a first pair of parallel links, and the proximal link 32C and the third arm 33 constitute a second pair of parallel links connecting the first pair of parallel links. In the transmission 31B, the first rotational axis member (the axial shaft 32D) transmits a rotational driving force to the first pair of parallel links, and the second rotational axis member (the hollow axial shaft 32E) transmits a rotational driving force to the second pair of parallel links through the proximal link 32C.

As described above, the axial shaft 32D of the driving link 32A is provided with the lower one of the second pulleys 31G integrated therewith, which has half the diameter of the lower one of the first pulleys 31F. The hollow axial shaft 32E is provided with the upper one of the second pulleys 31G integrated therewith, which has the same diameter as the upper one of the first pulleys 31F. Accordingly, when the first pulleys 31F rotate, the driving link 32A pivots by an angle two times larger than those of the first pulleys 31F, while the proximal link 32C pivots by the same angle as the first pulleys 31F, i.e. half that of the driving link 32A.

The proximal ends of the driving and driven links 32A and 32B are connected to the proximal link 32C at three points, while the distal ends of the driving and driven links 32A and 32B are also connected to the third arm 33 at three points. The three points on the proximal side and the three points on the distal side form triangles having the same size. Accordingly, as shown in FIG. 3B, when the driving link 32A and one of the driven links 32B are in a state of forming a dead point, the driving link 32A and the other of the driven links 32B are not in a state of forming a dead point. Further, as shown in FIG. 3C, when the first to third arms 31, 32, and 33 are stretched straight, the driving link 32A and each of the driven links 32B do not fall in a state of forming a dead point, though the pair of driven links 32B reach a dead point. Accordingly, when the arms start being returned to the initial position, the moment of rotation about the axial shaft 32D of the driving link 32A works on the pins 32F of the driven links 32B, so that the arms are smoothly and reliably moved up to the initial position.

The casing 31A of the first arm 31 is made of, for example, aluminum, and is formed as an airtight structure by O-rings and magnetic fluid seals. The second and third arms 32 and 33 are made of, for example, ceramics, which is excellent in corrosion resistance and heat resistance, and produces hardly any dust. The bearings 33D and 33E arranged at the pin-connecting portions between the second and third arms 32 and 33 are also made of, for example, ceramics, which is excellent in corrosion resistance and heat resistance, and produces hardly any dust. Accordingly, the pin-connecting portions are prevented from being damaged even when they enter a heated region, such as a heat-process chamber.

An explanation will be given on an operation of the transfer arm apparatus 30 with reference to FIGS. 2 and 3A to 3C. Assume here, for example, that the first motor 31I of the driving mechanism 31C is activated while the second motor 31J is stopped so that the first arm 31 pivots clockwise about the hollow shaft 31D from the initial state, i.e. the most compact state, as shown in FIG. 3A.

Figure 3A:
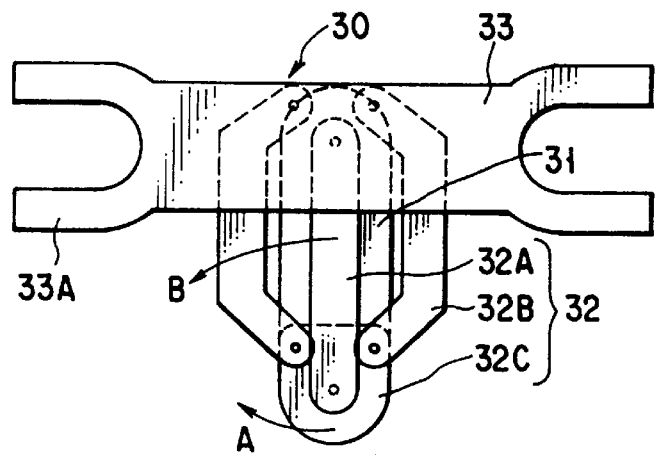
FIGS. 3A to 3C are views for explaining an operation of the transfer arm apparatus shown in FIG. 1.
Figure 3B:
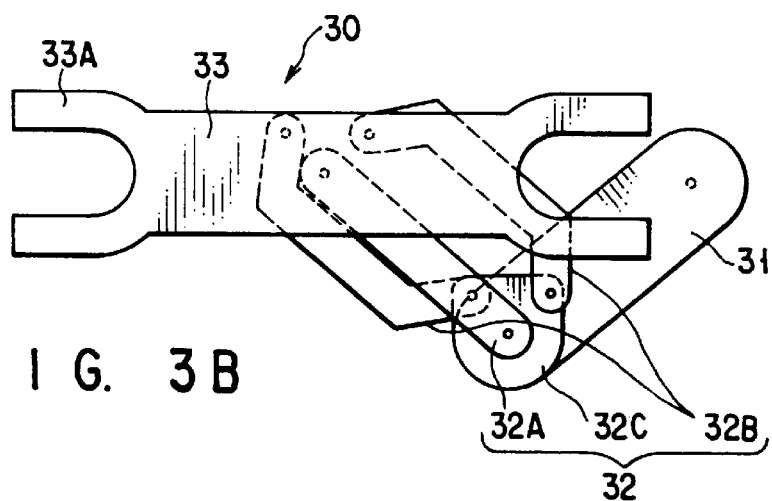
Figure 3C:
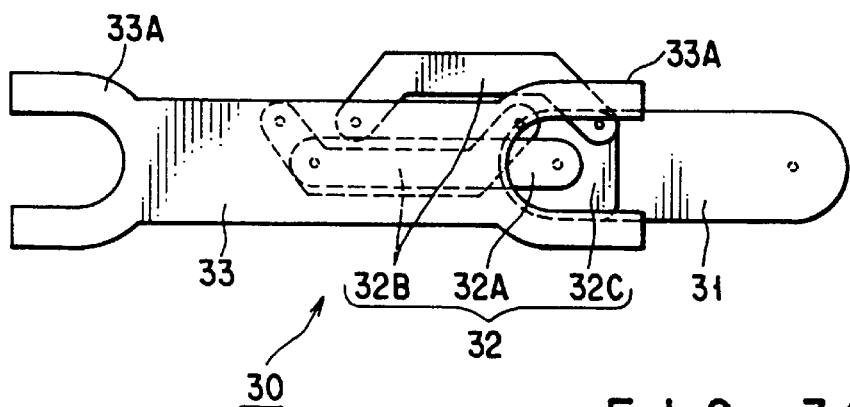

When the casing 31A of the first arm 31 is driven by the first motor 31I to pivot clockwise as indicated with an arrow A in FIG. 3A, the first pulleys 31F rotate counterclockwise relative to the hollow axial shaft 31F. During this time, like the first pulleys 31F, the second pulleys 31G also rotate counterclockwise as indicated with an arrow B in FIG. 3A. As a result, the second arm 32 pivots counterclockwise about the distal end of the first arm 31, as the angle between the arms 31 and 32 gradually increases.

The upper and lower ones of the second pulleys 31G have different outer diameters, and thus the driving link 32A and the proximal link 32C pivot by different amounts. More precisely, the pulley of the driving link 32A, i.e., the lower one of the second pulleys 31G, has half the diameter of the lower one of the first pulleys 31F, while the pulley of the proximal link 32C, i.e., the upper one of the second pulleys 31G, has the same diameter as the upper one of the first pulleys 31F. Accordingly, the driving link 32A pivots relative to the first arm 31 by twice the angle of the first arm 31 in the opposite direction, while the proximal link 32C pivots relative to the first arm 31 by the same angle as the first arm 31 in the opposite direction.

In other words, when the first arm 31 pivots clockwise by a certain angle from the initial state, the second arm 32, i.e., the driving and driven links 32A and 32B, pivots counterclockwise by twice the angle of the first arm 31 from the initial state through the proximal link 32C relative to the first arm 31. For example, as shown in FIG. 3B, when the first arm 31 pivots clockwise by 45° from the initial state, the second arm 32 pivots counterclockwise by 90° from the initial state relative to the first arm 31°. Further, as shown in FIG. 3C, when the first arm 31 pivots clockwise by 90° from the initial state, the second arm 32 pivots counterclockwise by 180° from the initial state relative to the first arm 31, and the first and second arms 31 and 32 reach a state where they are stretched straight.

Furthermore, as described above, the driving link 32A and each of the driven links 32B of the second arm 32 constitute the first pair of parallel links, and the proximal link 32C and the third arm 33 constitute the second pair of parallel links connecting the first pair of parallel links. Due to a function of such a parallel link mechanism, the third arm 33 remains parallel relative to the proximal link 32C while the first and second arms 31 and 32 are pivoting. Since the proximal link 32C pivots relative to the first arm 31 by the same angle as the first arm 31 in the opposite direction, the proximal link 32C keeps its orientation in the initial state, and thus the third arm 33 also keeps its orientation in the initial state, while the first and second arms 31 and 32 are pivoting. In addition, the distance between the pivotal axes of the first and second arms 31 and 32 and the distance between the pivotal axes of the second and third arms 32 and 33 are set equal. As a result of such a structure, the third arm 33 linearly moves on a line extending across the pivotal axis of the first arm 31 while the first, second, and third arms 31, 32, and 33 are operated.

For example, in the state shown in FIG. 3C, the proximal link 32C has pivoted counterclockwise by 90° from the initial state relative to the first arm 31, and the two pins 32F at the proximal ends of the pair of the driven links 32B are aligned back and forth along the longitudinal direction of the first arm 31. Consequently, the two pins 33C at the distal ends of the pair of the driven links 32B are also aligned back and forth along the longitudinal direction of the first arm 31. As a result, the longitudinal direction of the third arms 33 pin-connected to the second arm 32 and the longitudinal direction of the first arm 31 are aligned, and the first, second, and third arms 31, 32, and 33 reach a state where they are stretched most.

Note that, in the above described operation, only the casing 31A of the first arm 31 is driven by the first motor 31I, so that the second and third arms 32 and 33 are stretched while the first arm 31 is directed to a position, to and from which a wafer is transferred. On the other hand, when the first, second, and third arms 31, 32, and 33 are turned to face a different direction while keeping the initial state, the first and second motors 31I and 31J of the driving mechanism 31C are simultaneously driven. In this case, the first pulleys 31F are driven to rotate by an angle in a direction both the same as those of the first arm 31, so that the hollow axial shaft 31D of the casing 31A and the first pulleys 31F are moved while they remain stationary relative to each other.

With the above described operation of the transfer arm apparatus 30, wafers can be reliably transferred onto or from a wafer work table arranged in a heated chamber, such as heat-process chamber, by the wafer support portions 33A of the third arm 33. For example, when a processed wafer is unloaded from the heated chamber by one of the wafer support portions 33A, a wafer to be processed next is held by the other wafer support portion 33A. Sequentially, the first arm 31 is temporarily returned to the initial state, and the first, second, and third arms 31, 32, and 33 are turned to change their facing direction by 180° while keeping the initial state. Then, the first arm 31 is driven to pivot by 90° in a direction reverse to the above described case, so that the wafer to be processed is loaded in the heated chamber. By doing so, unloading of the processed wafer and loading of the wafer to be processed can be performed in series.

As described above, in the embodiment, the first arm 31 is structured as an arm containing a transmission, i.e., the pulley mechanism, and the second arm 32 is structured by the link mechanism. With this structure, the second arm 32 becomes mechanically simple, as compared to a transfer arm apparatus constituted by first and second arms containing pulley mechanisms, respectively. The connecting portion between the second and third arms 32 and 33 is provided with the bearings 33D and 33E made of ceramics. Accordingly, even if the distal end of the second arm 32 enters a heated chamber, it and its connecting portion to the third arm 33 are prevented from being damaged. Since the first arm 31 does not have to enter the heated chamber, its vacuum-seal structure is not damaged.

When the first, second, and third arms 31, 32, and 33 are fully stretched, the pair of the driven links 32B reach the dead point, but the main driving link 32A and each of the driven links 32B do not form any dead point. Accordingly, the arms can be smoothly returned to the initial state after they are fully stretched. In other words, first, second, and third arms 31, 32, and 33 can be stretched out, so that the maximum transfer stroke is attained.

The second and third arms 32 and 33 are accurately and reliably driven at all times by the transmission, i.e., the pulley mechanism 31B including the belts, in the first arm 31. Accordingly, the posture and transfer direction of the arms are accurately controlled, so that a transfer operation is stably performed. Further, since the vacuum-seal structure of the first arm 31 is never damaged, a wafer to be transferred is prevented from being contaminated with particles and impurity gases produced from the transmission.

Figure 8:
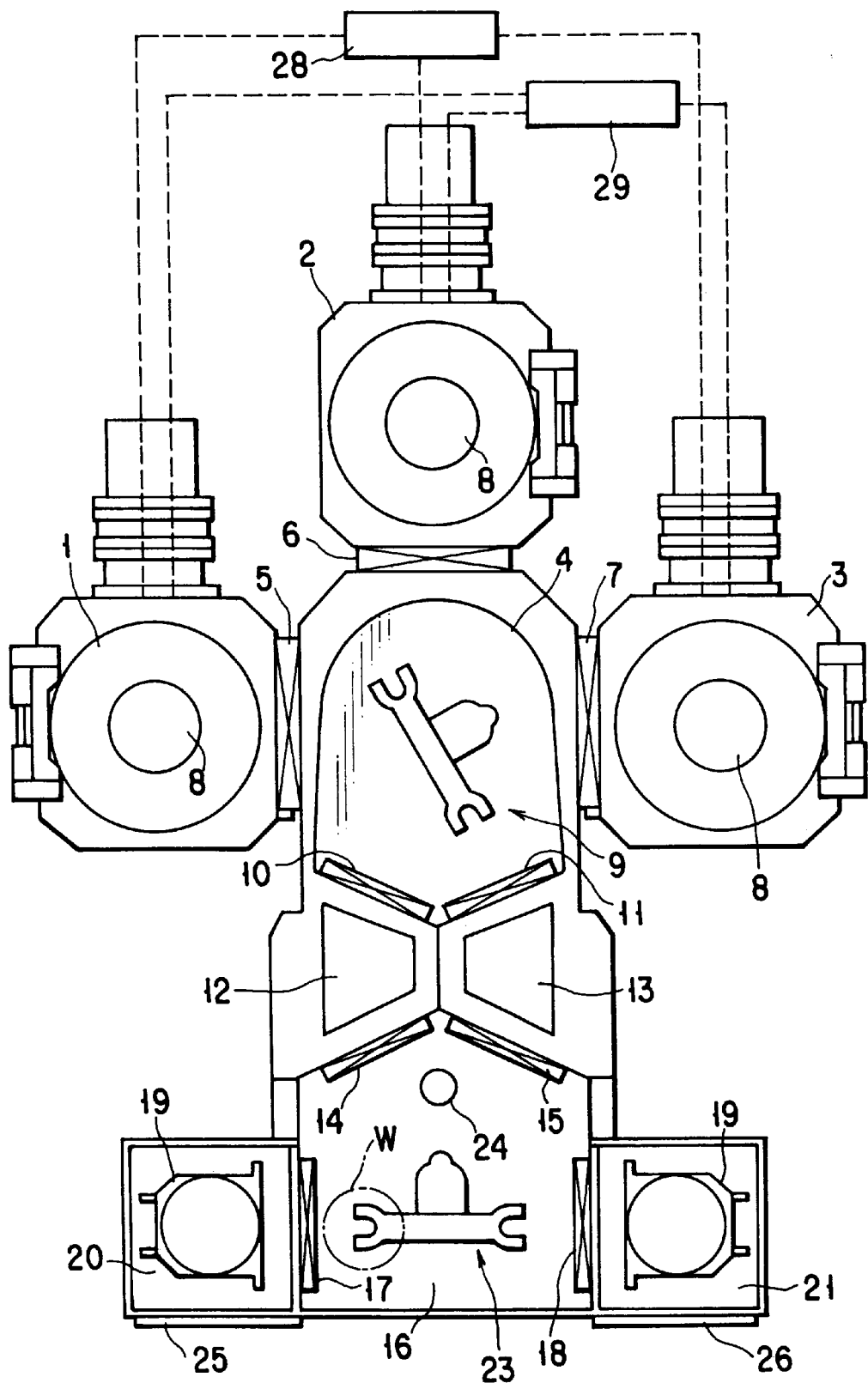
FIG. 8 is a plan view showing an example of a semiconductor processing system employing the transfer arm apparatus shown in FIG. 1.

The transfer arm apparatus 30 may be installed in a wafer transfer chamber of a plasma processing system, such as etching and CVD processes. FIG. 8 is a plan view layout showing an example of such a semiconductor processing system of a multi-chamber type employing the transfer arm apparatus 30.

The multi-chamber processing system includes three airtight process chambers 1, 2, and 3, for performing an etching, and a film-formation of a metal, such as tungsten, by means of, for example, thermal CVD, under certain vacuum atmospheres. A work table 8 for mounting a semiconductor wafer W is arranged in each of the process chambers 1, 2, and 3. The process chambers 1, 2, and 3 are connected to a supply system 28 for independently supplying a predetermined process gas into each of the chambers, and an exhaust system 29 for independently exhausting each of the chambers to set the inside into a vacuum state.

The process chambers 1, 2, and 3 are connected to three sides of an airtight first transfer chamber 4 respectively through gate valves 5, 6, and 7. The process chambers 1, 2, and 3 and the first transfer chamber 4 are selectively caused to communicate and not communicate with each other by the gate valves 5, 6, and 7. A first transfer arm apparatus 9 for transferring wafers W is arranged at the center inside the first transfer chamber 4. The first transfer arm apparatus 9 has the above described structure of the transfer arm apparatus 30. Two airtight load lock chambers 12 and 13 are connected to the other side of an airtight first transfer chamber 4 side by side respectively through gate valves 10 and 11. The load lock chambers 12 and 13 and the first transfer chamber 4 are selectively caused to communicate and not communicate with each other by the gate valves 10 and 11.

A wafer W is transferred by the first transfer arm apparatus 9 from, for example, the load lock chamber 12 into one of the process chambers under a certain vacuum atmosphere. The wafer W is transferred by the first transfer arm apparatus 9 into the process chambers 1, 2, and 3 sequentially, and is subjected to a certain process, such film formation or etching, in each of the process chambers 1, 2, and 3. After all the processes are completed, the wafer W is transferred by the first transfer arm apparatus 9 into the other load lock chamber 13.

The load lock chambers 12 and 13 are connected to a second transfer chamber 16 respectively through gate valves 14 and 15 on the side opposite to the gate valves 10 and 11. The load lock chambers 12 and 13 and the second transfer chamber 16 are selectively caused to communicate and not communicate with each other by the gate valves 14 and 15. Cassette chambers 20 and 21 each for storing a cassette are connected to left and right sides, respectively, of the second transfer chamber 16 through gate valves 17 and 18. The cassette chambers 20 and 21 and the second transfer chamber 16 are selectively caused to communicate and not communicate with each other by the gate valves 17 and 18. A second transfer arm apparatus 23 is arranged for transferring a wafer W among the load lock chambers 12 and 13 and the cassette chambers 20 and 21 inside the second transfer chamber 16 at the center between the left and right cassette chambers 20 and 21. The second transfer arm apparatus 23 also has the above described structure of the transfer arm apparatus 30.

A positioning apparatus 24 for positioning a wafer W on the basis of its orientation flat is arranged between the second transfer arm apparatus 23 and the load lock chambers 12 and 13. The wafer W is positioned by the positioning apparatus 24 and then is transferred to the load lock chamber 12 by the second transfer arm apparatus 23. Gate valves 25 and 26 are arranged on the front sides of the cassette chambers 20 and 21.

Figure 4A:
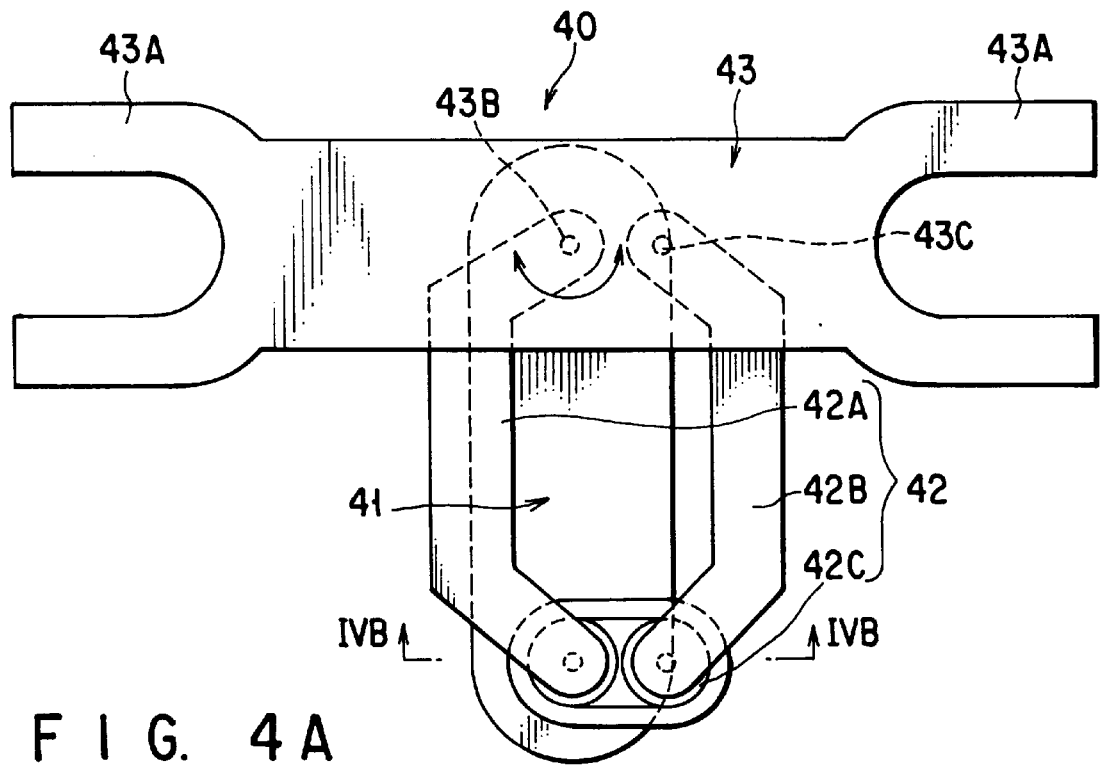
FIGS. 4A and 4B are a plan view showing a transfer arm apparatus according to another embodiment of the present invention, and a cross-sectional view taken along line IVB—IVB in FIG. 4A, respectively.
Figure 4B:
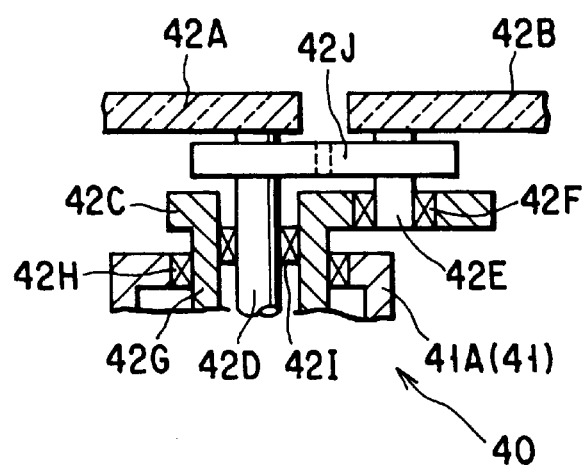

FIGS. 4A and 4B are a plan view showing a transfer arm apparatus according to another embodiment of the present invention, and a cross-sectional view taken along line IVB—IVB in FIG. 4A, respectively.

A transfer arm apparatus 40 according to this embodiment has a first arm 41 mounted on a base table 35 (see FIG. 2), a second arm 42 connected by its proximal end to the distal end of the first arm 41, and a third arm 43 connected by its central portion to the distal end of the second arm 42. The first and second arms 41 and 42 are bent and stretched relative to each other so that the third arm 43 is operable. Wafer support portions 43A each for supporting a semiconductor wafer are formed at the opposite ends of the third arm 43, respectively. Accordingly, the transfer arm apparatus 40 can transfer two wafers at a time while supporting the wafers on the wafer support portions 43A, respectively. The first arm 41 is structured similarly to the first arm 31 of the former embodiment. An explanation, therefore, will be made mainly on the second and third arms 42 and 43, rather than the first arm 41.

As shown in FIGS. 4A and 4B, the second arm 42 has first and second driving links 42A and 42B. The first driving link 42A pivotally connected directly to the first arm 41 while the second driving link 42B is pivotally connected to the first arm 41 through a proximal link 42C. The first and second links 42A and 42B, the proximal link 42C, and the third arm 43 are connected, so that a parallel link mechanism is constituted. As shown in FIG. 4A, the first and second driving links 42A and 42B have shapes, in their plan view, the same as those of the driven links 32B shown in FIG. 1, and are arranged at a height level the same as that of the driven links 32B.

An axial shaft 42D used as the first rotational axis member extends downward from the bottom surface of the proximal end of the first driving link 42A. The axial shaft 42D functions as an axial shaft of the lower one of the second pulleys in the first arm 41, i.e., the lower one of the second pulleys 31G shown in FIG. 2. A pin 42E extends downward from the bottom surface of the proximal end of the second driving link 42B. The pin 42E is rotatably supported by a bearing 42E in a hole formed in one end, i.e., the right end in FIG. 4B, of the proximal link 42C which has an essentially elliptic and long shape.

A hollow axial shaft 42G extends downward from the other end, i.e., the left end in FIG. 4B, of the proximal link 42C. The hollow axial shaft 42G is rotatably supported by a bearing 42H in a hole formed in the distal end of the casing 41A of the first arm 41. The axial shaft 42D of the first driving link 42A coaxially penetrates the hollow axial shaft 42G, and is supported by a bearing 42I therein.

In other words, in this embodiment, the first and second driving links 42A and 42B of the second arm 42 constitute a first pair of parallel links, and the proximal link 42C and the third arm 43 constitute a second pair of parallel links connecting the first pair of parallel links. In the transmission, the first rotational axis member (the axial shaft 42D) transmits a rotational driving force to the first pair of parallel links, and the second rotational axis member (the hollow axial shaft 42G) transmits a rotational driving force to the second pair of parallel links through the proximal link 42C.

The axial shaft 42D of the first driving link 42A and the pin 42E of the second driving link 42B are provided with pulleys, respectively, above the proximal link 42C. A belt 42J is wound around the pulleys, so that a pulley mechanism is constituted. Accordingly, when the axial shaft 42D is driven to rotate, the first driving link 42A pivots through the driving shaft 42D and the second driving link 42B pivots through the belt 42J by an angle and in a direction both the same as those of the first driving link 42A. Further, the first and second driving links 42A and 42B pivot by twice the angle of the first arm 41 in a direction reverse thereto. The proximal link 42C pivots by the same angle as the first arm 41 in a direction reverse thereto.

Two pins 43B and 43C extend downward from the center of the third arm 43 and are separated from each other in the longitudinal direction of the third arm 43. The pins 43B and 43C are rotatably supported by bearings (not shown) in holes formed in the distal ends of the first and second driving links 42A and 42B.

An explanation will be given on an operation of the transfer arm apparatus 40. Assume here, for example, that the first arm 41 pivots clockwise by 90° from the initial state, as shown in FIG. 4A. In this case, the first and second driving links 42A and 42B of the second arm 42 pivot counterclockwise by 180°, i.e., twice the angle of the first arm 41, relative to the first arm 41 through the belt 42J. At the same time, the proximal link 42C pivots by 90° relative to the first arm 41. As a result, the second arm 42 becomes fully stretched relative to the first arm 41.

Due to a function of such a parallel link mechanism, the third arm 43 remains parallel relative to the proximal link 42C while the first and second arms 41 and 42 are pivoting. Since the proximal link 42C pivots relative to the first arm 41 by the same angle as the first arm 41 in the opposite direction, the proximal link 42C keeps its orientation in the initial state, and thus the third arm 43 also keeps its orientation in the initial state, while the first and second arms 41 and 42 are pivoting. In addition, the distance between the pivotal axes of the first and second arms 41 and 42 and the distance between the pivotal axes of the second and third arms 42 and 43 are set equal. As a result of such a structure, the third arm 43 linearly moves on a line extending across the pivotal axis of the first arm 41 while the first, second, and third arms 41, 42, and 43 are operated.

In this embodiment, when the first and second arms 41 and 42 are returned to the initial state after they are fully stretched, the moment of rotation of the first driving link 42A works on the second driving link 42B through the belt 42J. Accordingly, even when the first and second arms 41 and 42 are stretched out and the parallel link mechanism is at a dead point, the second arm 42 is smoothly activated to move. As a result, the first, second, and third arms 41, 42, and 43 can be stably operated to accurately transfer a wafer to a predetermined position. In addition, the transfer arm apparatus 40 can present advantages similar to those of the transfer arm apparatus 30 shown in FIG. 1.

Figure 5A:
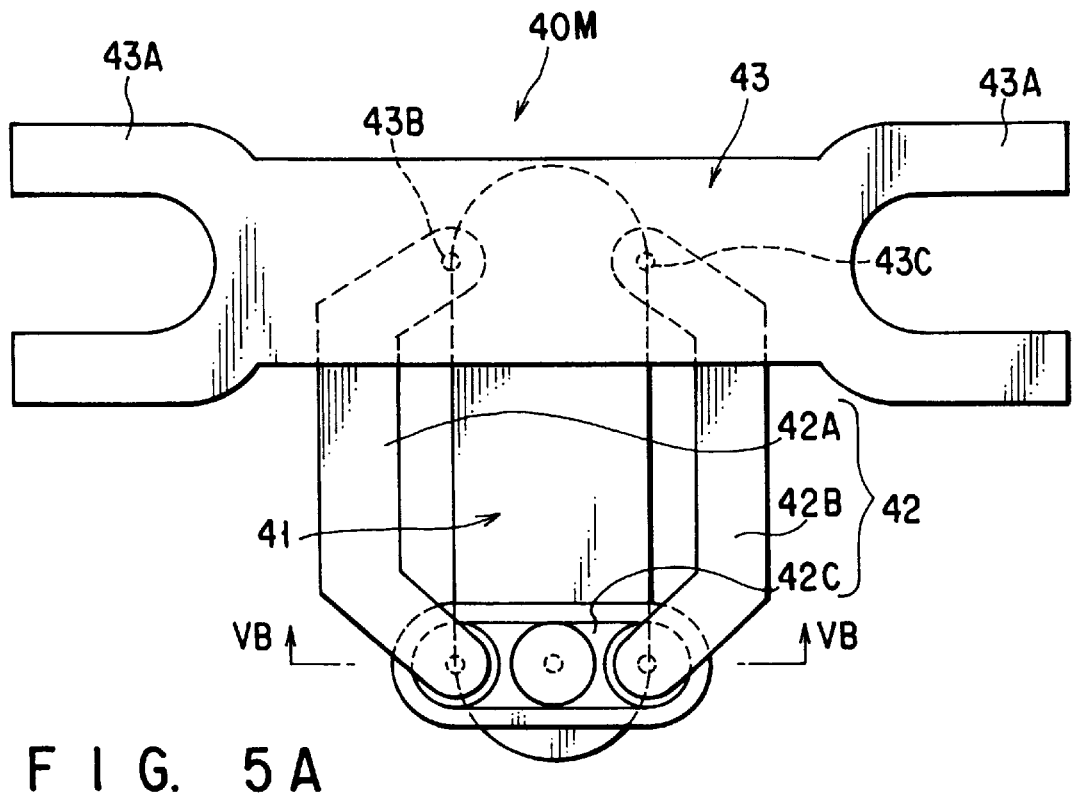
FIGS. 5A and 5B are a plan view showing a transfer arm apparatus according to a modification of the embodiment shown in FIGS. 4A and 4B, and a cross-sectional view taken along line VB—VB in FIG. 5A, respectively.
Figure 5B:
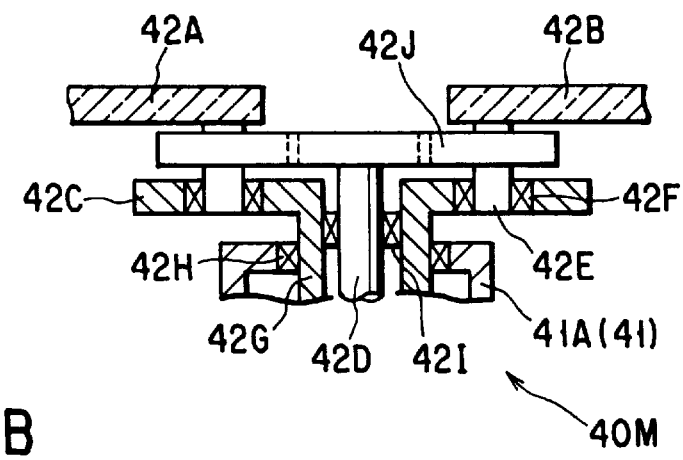

FIGS. 5A and 5B are a plan view showing a transfer arm apparatus according to a modification of the embodiment shown in FIGS. 4A and 4B, and a cross-sectional view taken along line VB—VB in FIG. 5A, respectively. The transfer arm apparatus 40 has the first and second driving links 42A and 42B, which are asymmetrically arranged relative to the line connecting the pivotal axes of the first and second arms 41 and 42. In contrast, a transfer arm apparatus 40M shown in FIGS. 5A and 5B has first and second driving links 42A and 42B, which are symmetrically arranged relative to the line connecting the pivotal axes of first and second arms 41 and 42. Besides this feature, the transfer arm apparatus 40M is designed to have the same structure as the transfer arm apparatus 40, and thus its detailed explanation is omitted while the common reference symbols are used between the transfer arm apparatuses 40 and 40M.

FIGS. 6A and 6B are a plan view showing a transfer arm apparatus according to still another embodiment of the present invention, and a cross-sectional view taken along line VIB—VIB in FIG. 6A, respectively.

A transfer arm apparatus 50 according to this embodiment has a first arm 51 mounted on a base table 35, a second arm 52 connected by its proximal end to the distal end of the first arm 51, and a third arm 53 connected by its central portion to the distal end of the second arm 52. The first and second arms 51 and 52 are bent and stretched relative to each other so that the third arm 53 is operable. Wafer support portions 53A each for supporting a semiconductor wafer are formed at the opposite ends of the third arm 53, respectively. Accordingly, the transfer arm apparatus 50 can transfer two wafers at a time while supporting the wafers on the wafer support portions 53A, respectively. The first and second arms 51 and 52 differ from those of the former embodiments, as described later, but the third arm 53 is the same as that of the former embodiments except for a pin-connecting fashion.

As shown in FIGS. 6A and 6B, the first arm 51 is formed of a casing 51A which contains a transmission 51B different from that contained in the first arm 31 shown in FIG. 2. The transmission 51B includes a first pulley 51C arranged on the proximal side of the casing 51A, a second pulley 51D arranged on the distal side of the casing 51A and having twice the diameter of the first pulley 51C, and a belt 51E wound around the first and second pulleys 51C and 51D.

The axial shaft of the first pulley 51C coaxially penetrates the hollow axial shaft of the casing 51A along its axial center. The second pulley 51D is fixed to the bottom of a proximal link 52C having a box shape. The second pulley 51D is rotatably supported by a bearing on a fixed axial shaft 51G which extends upward from the casing 51A. A third pulley 51F is formed at the top end of the fixed axial shaft 51G.

As shown in FIGS. 6A and 6B, the second arm 52 has first and second links 52A and 52B one above the other, which have long, narrow shapes and the same length. The first and second driving links 52A and 52B are arranged such that their centers in their longitudinal directions are slightly shifted from each other in the initial state shown in FIG. 6A. Axial shafts 52D and 52E extend downward from the proximal ends of the first and second driving links 52A and 52B, respectively. Each of the axial shafts 52D and 52E is rotatably supported by a bearing 52F in a hole formed in the upper wall of the box-like proximal link 52C.

The axial shafts 52D and 52E are provided with fourth and fifth pulleys 52G and 52H, respectively, one on either side of the third pulley 51F, and each having the same diameter as the third pulley 51F. Two belts, i.e., upper and lower belts 52I are wound around the third pulley 51F and both of the forth and fifth pulleys 52G and 52H in the opposite directions to cross each other. Accordingly, the forth and fifth pulleys 52G and 52H rotate by the same angle as the third pulley 51F in a direction reverse thereto.

Holes are formed at the distal ends of the first and second driving links 52A and 52B such that the distance therebetween is set the same as that between the axial shafts 52C and 52E. Pins 53B and 53C extend downward from the bottom surface of the third arm 53 and are rotatably supported by bearings 53D and 53E in the holes at the distal ends of the first and second driving links 52A and 52B. The pins 53B and 53C are arranged at the center in the longitudinal direction of the third arm 53 and are separated from each other in the width direction of the third arm 53. The first and second links 52A and 52B of the second arm 52 form bridges between the box-like proximal link 52C, which supports the axial shafts at the proximal ends of the links 52A and 52B, and the third arm 53, which is pin-connected to the distal ends of the links 52A and 52B, so that a parallel link mechanism is constituted.

In other words, in this embodiment, the first and second driving links 52A and 52B of the second arm 52 constitute a first pair of parallel links, and the proximal link 52C and the third arm 53 constitute a second pair of parallel links connecting the first pair of parallel links. In the transmission 51B, the first rotational axis member (the third pulley 51F) transmits a rotational driving force to the first pair of parallel links, and the second rotational axis member (the second pulley 51D) transmits a rotational driving force to the second pair of parallel links through the proximal link 52C.

In the initial state shown in FIG. 6A, the parallel link mechanism of the second arm 52 is at a dead point. When the arms are activated from this state, the first and second driving links 52A and 52B are driven by the forth and fifth pulleys 52G and 52H to pivot about their axial shafts. As a result, the first and second driving links 52A and 52B are reliably and stably driven by the forth and fifth pulleys 52G and 52H without reference to the dead point.

Unlike the former embodiments, the first pulley 51C has half the diameter of the second pulley 51D in this embodiment. For this reason, the first pulley 51C has to be driven to rotate in synchronism with the first arm 51 by the same angle as the first arm 51 in a direction reverse thereto. By simultaneously driving the first pulley 51C and the first arm 51 to rotate and pivot in opposite directions, the first, second, and third arms 51, 52, and 53 become operable essentially equally to those of the former embodiments. In other words, first, second, and third arms 51, 52, and 53 can be operable between the initial state shown in FIG. 6A and the linearly stretched state, so that the maximum transfer stroke of the link mechanism is attained.

More specifically, assume that the first arm 51 is driven to pivot by a certain angle while the first pulley 51C of the transmission remains stationary. In this case, the second pulley 51D, box-like proximal link 52C, and forth and fifth pulleys 52G and 52H rotate by half the angle of the first arm 51 in a direction reverse thereto. Further, the forth and fifth pulleys 52G and 52H also rotate relative to the box-like proximal link 52C by half the angle of the first arm 51 in a direction reverse thereto. This is because, the third pulley 51F fixed to the casing 51A and both of the forth and fifth pulleys 52G and 52H are connected by the two belts, i.e., upper and lower belts 52I wound around them to extend in opposite directions and to cross each other. Accordingly, when only the first arm 51 pivots by 90°, the second arm 52 pivots by 90° in the opposite direction relative to the first arm 51, and the first and second arms 51 and 52 come to a state where they form a right angle and are not fully stretched.

In contrast, assume that the first arm 51 is driven to pivot while the first pulley 51C of the transmission is simultaneously driven to rotate by an angle the same as the first arm 51 in a direction reverse thereto. In this case, the first and second arms 51 and 52 form an angle two times larger than the pivotal angle of the first arm 51. Accordingly, when the first arm 51 pivots by 90°, the second arm 52 pivots by 180° relative to the first arm 51, so that the first, second, and third arms 51, 52, and 53 are fully and linearly stretched.

Further, due to a function of the parallel link mechanism, the third arm 53 remains parallel relative to the proximal link 52C while the first and second arms 51 and 52 are pivoting. Since the proximal link 52C pivots relative to the first arm 51 by the same angle as the first arm 51 in the opposite direction, the proximal link 52C keeps its orientation in the initial state, and thus the third arm 53 also keeps its orientation in the initial state, while the first and second arms 51 and 52 are pivoting. In addition, the distance between the pivotal axes of the first and second arms 51 and 52 and the distance between the pivotal axes of the second and third arms 52 and 53 are set equal. As a result of such a structure, the third arm 53 linearly moves on a line extending across the pivotal axis of the first arm 51 while the first, second, and third arms 51, 52, and 53 are operated.

In the transfer arm apparatus 50, even when the parallel link mechanism of the second arm 52 is at the dead point, the first and second driving links 52A and 52B are positively driven to pivot by the forth and fifth pulleys 52G and 52H, so that the second arm 52 is reliably and accurately activated from the dead point. In addition, the transfer arm apparatus 50 can present advantages similar to those of the transfer arm apparatus 30 shown in FIG. 1.

Figure 7A:
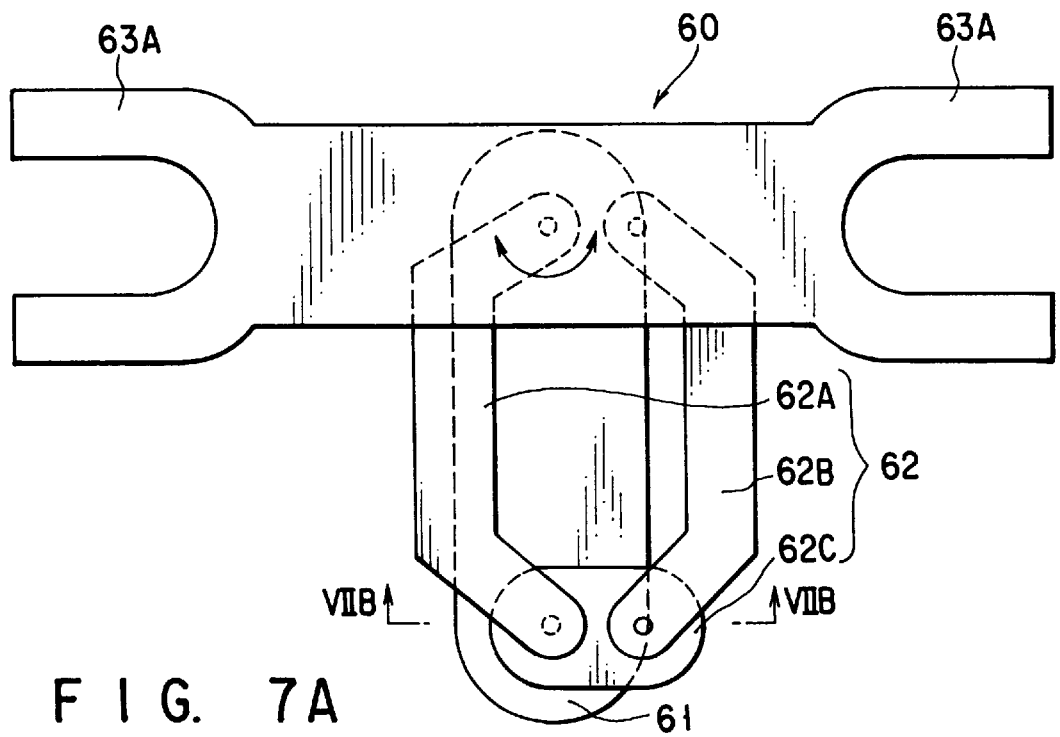
FIGS. 7A and 7B are a plan view showing a transfer arm apparatus according to still another embodiment of the present invention, and a cross-sectional view taken along line VIIB—VIIB in FIG. 7A, respectively.
Figure 7B:
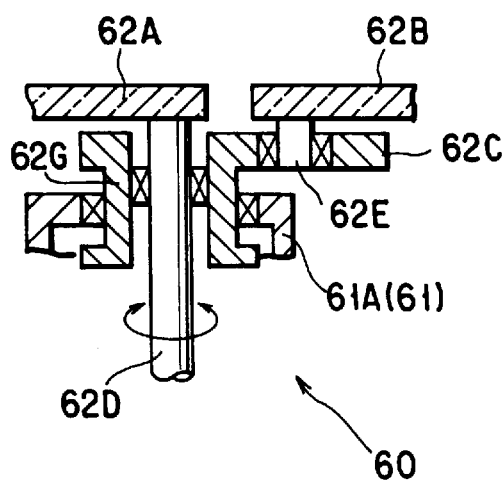
Figure 9:
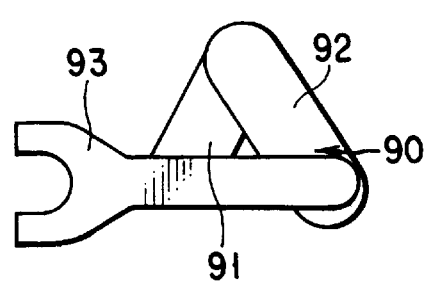
FIG. 9 is a plan view schematically showing a conventional transfer arm apparatus.

FIGS. 7A and 7B are a plan view showing a transfer arm apparatus according to still another embodiment of the present invention, and a cross-sectional view taken along line VIIB—VIIB in FIG. 7A, respectively.

A transfer arm apparatus 60 according to this embodiment has a first arm 61 mounted on a base table 35 (see FIG. 2), a second arm 62 connected by its proximal end to the distal end of the first arm 61, and a third arm 63 connected by its central portion to the distal end of the second arm 62. The first and second arms 61 and 62 are bent and stretched relative to each other so that the third arm 63 is operable. Wafer support portions 63A each for supporting a semiconductor wafer are formed at the opposite ends of the third arm 63, respectively. Accordingly, the transfer arm apparatus 60 can transfer two wafers at a time while supporting the wafers on the wafer support portions 63A, respectively.

The transfer arm apparatus 60 is designed to be the same as the transfer arm apparatus 40 except that the pulley mechanism including the belt (only the belt 42J is provided with a reference symbol in FIG. 4B) for the second arm 42 is omitted. The transfer arm apparatus 60, therefore, will be mainly explained in terms of the differences from the transfer arm apparatus 40.

A second arm 62 has a driving link 62A and a driven link 62B. The driving link 62A rotatably supported directly by a first arm 61, while the driven link 62B is rotatably supported by the first arm 61 through a proximal link 62C. A parallel link mechanism is constituted by the driving link 62A, the driven link 62B, the proximal link 62C, and a third arm 63. The driving link 62A and the proximal link 62C have an axial shaft 62D and the hollow axial shaft 62G, respectively, which have a common axial center. The axial shaft 62D is rotatably supported in the hollow axial shaft 62G which, in return, is rotatably supported in a hole formed in the distal end of a casing 61A. The driven link 62B has a pin 62E which is rotatably supported in a hole formed in the proximal link 62C.

In other words, in this embodiment, the driving link 62A and the driven link 62B of the second arm 62 constitute a first pair of parallel links, and the proximal link 62C and the third arm 63 constitute a second pair of parallel links connecting the first pair of parallel links. In the transmission, the first rotational axis member (the axial shaft 62D) transmits a rotational driving force to the first pair of parallel links, and the second rotational axis member (the hollow axial shaft 62G) transmits a rotational driving force to the second pair of parallel links through the proximal link 62C.

Note that the driven link 62B is a link which follows movement of the driving link 62A, unlike the second driving link 43B shown in FIG. 4A. Since the driven link 62B is not positively driven, movement of the second arm 62 becomes unstable, as in an ordinary parallel link mechanism, at or near a dead point formed by the driving link 62A and the driven link 62B. Accordingly, unlike the former embodiments, this embodiment does not allow the first and second arms 61 and 62 to be fully stretched, and thus its transfer stroke becomes insufficient, as compared to the former embodiments. On the other hand, however, this embodiment allows an arm structure to be simple, as compared to a case where a pulley mechanism is contained in each of the first and second arms.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer arm apparatus for a semiconductor process, comprising:

a first arm bidirectionally pivotable about its proximal end;

a second arm connected by its proximal end to a distal end of the first arm, said second arm being bidirectionally pivotable about its proximal end relative to said first arm;

a third arm connected by its central portion to a distal end of the second arm, said third arm having support portions, each for supporting a target substrate, on opposite ends;

wherein said second arm has a proximal link pivotally mounted on said distal end of said first arm, and first and second links connecting said proximal link and said third arm to constitute a link mechanism, said first and second links forming a first pair of parallel links, and said proximal link and said third arm forming a second pair of parallel links connecting said first pair of parallel links;

a transmission supported by said first arm, and having first and second rotational axis members coaxially arranged at said distal end of said first arm, said first rotational axis member being for transmitting a rotational driving force to said first pair of parallel links, and said second rotational axis member being for transmitting a rotational driving force to said second pair of parallel links through said proximal link; and a driving mechanism for supplying said rotational driving forces to said first arm and said transmission;

wherein said first link consists of a driving link directly connected to said first rotational axis member, and said second link consists of a driven link freely and pivotally mounted on the proximal link.

2. The apparatus according to claim 1, wherein said driving mechanism has first and second driving motors for supplying said rotational driving forces to said first arm and said transmission, respectively.

3. The apparatus according to claim 2, comprising first and second root axial shafts for transmitting said rotational driving forces from said first and second driving motors to said first arm and said transmission, respectively, wherein at least one of said first and second root axial shafts is a hollow axial shaft and said first and second root axial shafts are coaxially arranged.

4. The apparatus according to claim 3, wherein said first arm is pivotally mounted on a base table through said first root axial shaft, and said first and second driving motors are arranged under said base table.

5. The apparatus according to claim 1, wherein said second rotational axis member comprises a hollow axial shaft which coaxially surrounds said first rotational axis member.

6. The apparatus according to claim 1, wherein said transmission is formed essentially of a pulley mechanism comprising pulleys and a belt.

7. The apparatus according to claim 1, wherein said second and third arms are connected to each other by a bearing made of a heat resistant material.

8. The apparatus according to claim 1, wherein said first rotational axis member is fixed to said first link.

9. The apparatus according to claim 1, wherein said second arm comprises a third link connecting said proximal link and said third arm, said third link consists of a driven link freely and pivotally mounted on the proximal link, such that said first and third links form a pair of parallel links.

10. The apparatus according to claim 9, wherein said second and third links are symmetrically arranged to interpose said first link therebetween.

11. The apparatus according to claim 1, wherein said first and second links are arranged at different height levels relative to said first arm.

12. The apparatus according to claim 1, wherein said proximal link is driven to pivot relative to said first arm by an angle the same as that of said first arm in a direction reverse to that of said first arm.

13. The apparatus according to claim 12, wherein said first and second links are driven to pivot relative to said first arm by an angle two times larger than that of said first arm in a direction reverse to that of said first arm.

14. The apparatus according to claim 13, wherein a distance between pivotal axes of said first and second arms and a distance between pivotal axes of said second and third arms are set to be the same.

15. A semiconductor processing system, comprising:

an airtight process chamber which is provided with a work table arranged in said process chamber for supporting a target substrate, a supply for supplying a process gas into said process chamber, and an exhaust for exhausting and setting said process chamber into a vacuum state; and an airtight transfer chamber which is connected to said process chamber through a gate valve and is provided with a transfer arm apparatus for loading and unloading target substrates to and from said process chamber;

wherein said transfer arm apparatus includes a first arm bidirectionally pivotable about its proximal end, a second arm connected by its proximal end to a distal end of the first arm, said second arm being bidirectionally pivotable about its proximal end relative to said first arm, a third arm connected by its central portion to a distal end of the second arm, said third arm having support portions, each for supporting a target substrate, on opposite ends, wherein said second arm has a proximal link pivotally mounted on said distal end of said first arm, and first and second links connecting said proximal link and said third arm to constitute a link mechanism, said first and second links forming a first pair of parallel links, and said proximal link and said third arm forming a second pair of parallel links connecting said first pair of parallel links, a transmission supported by said first arm, and having first and second rotational axis members coaxially arranged at said distal end of said first arm, said first rotational axis member being for transmitting a rotational driving force to said first pair of parallel links, and said second rotational axis member being for transmitting a rotational driving force to said second pair of parallel links through said proximal link, and a driving mechanism for supplying said rotational driving forces to said first arm and said transmission, wherein said first link consists of a driving link directly connected to said first rotational axis member, and said second link consists of a driven link freely and pivotally mounted on the proximal link.

16. The system according to claim 15, comprising an airtight second process chamber which is connected to said transfer chamber through a gate and is provided with a work table arranged in said process chamber for supporting a target substrate, a supply for supplying a process gas into said process chamber, and an exhaust for exhausting and setting said process chamber into a vacuum state, wherein said transfer arm apparatus is used for loading and unloading target substrates to and from said second process chamber.

* * * * *